United States Patent
Panasik

(10) Patent No.: US 6,452,310 B1
(45) Date of Patent: *Sep. 17, 2002

(54) THIN FILM RESONATOR AND METHOD

(75) Inventor: Carl M. Panasik, Garland, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/484,804

(22) Filed: Jan. 18, 2000

(51) Int. Cl.⁷ .................................... H01L 41/08
(52) U.S. Cl. ............... 310/334; 310/358; 310/359
(58) Field of Search ................ 310/334, 335, 310/336, 311, 366, 328, 357, 358, 359

(56) References Cited

U.S. PATENT DOCUMENTS

| | | | | |
|---|---|---|---|---|
| 2,633,543 A | * | 3/1953 | Howatt | 310/358 |
| 3,590,287 A | * | 6/1971 | Berlincourt | 310/366 |
| 4,166,967 A | * | 9/1979 | Benes | 310/334 X |
| 4,348,075 A | | 9/1982 | Gottlieb et al. | 350/96.13 |
| 4,356,424 A | * | 10/1982 | Marcus | 310/357 |
| 4,375,042 A | * | 2/1983 | Marcus | 310/357 |
| 4,395,702 A | | 7/1983 | Gottlieb et al. | 340/347 |
| 4,502,932 A | | 3/1985 | Kline et al. | 204/192 |
| 4,556,812 A | | 12/1985 | Kline et al. | 310/324 |
| 4,564,782 A | * | 1/1986 | Ogawa | 310/359 |
| 4,749,900 A | * | 6/1988 | Hadimioglu et al. | 310/334 |
| 4,771,205 A | * | 9/1988 | Maquio | 310/334 |
| 4,785,269 A | | 11/1988 | Adam et al. | 333/188 |
| 4,798,990 A | * | 1/1989 | Henoch | 310/334 |
| 4,988,957 A | | 1/1991 | Thompson et al. | 331/107 |
| 5,075,641 A | | 12/1991 | Weber et al. | 331/108 |
| 5,118,982 A | * | 6/1992 | Inoue et al. | 310/328 X |
| 5,166,646 A | | 11/1992 | Avanic et al. | 331/107 |
| 5,233,256 A | * | 8/1993 | Hayashi et al. | 310/358 X |
| 5,233,259 A | | 8/1993 | Krishnaswamy et al. | 310/324 |
| 5,294,898 A | | 3/1994 | Dworsky et al. | 333/187 |
| 5,337,185 A | | 8/1994 | Meier et al. | 359/321 |
| 5,361,077 A | | 11/1994 | Weber | 343/846 |
| 5,367,308 A | | 11/1994 | Weber | 343/700 |
| 5,373,268 A | | 12/1994 | Dworsky et al. | 333/187 |
| 5,691,752 A | * | 11/1997 | Moynihan et al. | 310/328 X |
| 5,821,833 A | | 10/1998 | Lakin | 333/187 |
| 5,932,953 A | | 8/1999 | Drees et al. | 310/324 |

OTHER PUBLICATIONS

U.S. Patent Appl. Ser. No. 09/022,905 entitled "Low Cost Packaging for Thin–Film Resonators and Thin–Film Resonator–Based Filters"; Feb. 12, 1998.

* cited by examiner

Primary Examiner—Mark O. Budd
(74) Attorney, Agent, or Firm—Pedro P. Hernandez; W. James Brady, III; Frederick J. Telecky, Jr.

(57) ABSTRACT

A thin film resonator and method includes a first electrode (110) and a second electrode (112) substantially parallel to the first electrode (110). An intermediate layer (120) is disposed between and coupled to the first and second electrode (110, 112). The intermediate layer (120) includes a first piezoelectric layer (122), a second piezoelectric layer (124), and a spacer layer (130) disposed between the first and second piezoelectric layers (122, 124). The spacer layer (130) has an acoustic impedance substantially the same as the first and second piezoelectric layers (122, 124) and is formed of a disparate material.

14 Claims, 2 Drawing Sheets

THIN FILM RESONATOR AND METHOD

TECHNICAL FIELD OF THE INVENTION

The present invention relates generally to the field of frequency selection elements, and more particularly to a thin film resonator and method.

BACKGROUND OF THE INVENTION

Televisions and radios as well as cellular phones and other wireless devices all transmit and/or receive radio frequency signals. Televisions and radios, for example, receive programming from a number of stations in the form of radio frequency signals that are transmitted by the stations. Cellular phones and other two-way wireless communication devices communicate with a base station by both transmitting and receiving radio frequency signals. The radio frequency signals include voice traffic for a wireless telephone connection or data traffic for a wireless Internet or other network connection.

Televisions, radios, cellular phones and other wireless devices are each assigned to different radio frequencies to allow simultaneous operation of the devices within an area. Television, for example, receives signals within the 55 to 800 megahertz (MHz) range while radio receives signals within the 530 to 1,700 kilohertz (kHz) range for AM and within the 88 to 108 megahertz (MHz) range for FM. Cellular phones, in accordance with U.S. standards, operate in the 900 and 1800 megahertz (MHz) range.

Televisions, radios, cellular phones, and other wireless devices each use radio frequency filters to separate out unwanted radio frequency traffic from a desired signal, or channel. In particular, televisions and radios use a number of filters to form a tuner that allows each of the received stations to be selectively tuned. Cellular phones operate at a preset frequency range and include filters dedicated to that frequency range. In each case, the filters discriminate between signals based on frequency diversity to provide a stable signal for use by the receiving device.

Radio frequency filters based on resonators are constructed from pairs of inductors and capacitors arranged in parallel, from crystal resonators and from thin film resonators. The inductor and capacitor configuration resonates in a broad range and therefore provides low quality signal discrimination. Crystal and thin film resonators, on the other hand, resonate in a narrow range and therefore provide high quality signal discrimination.

Crystal resonators include a crystal positioned between a pair of posts. Although crystal resonators provide high signal discrimination, they are limited to applications below 500 megahertz (MHz) due to crystal thickness limitations. As a result, crystal resonators are not suitable for cellular and other lower ultra high frequency (UHF) applications in the 300 to 3000 megahertz (MHz) range.

Thin film resonators are formed on a substrate that includes an acoustic reflector. The acoustic reflector may be formed by an air-gap or a number of reflecting layers. The thin film resonator includes a piezoelectric layer positioned between two electrodes. The piezoelectric layer may comprise zinc oxide (ZnO). Zinc oxide surface acoustic wave (SAW) devices have been developed as thin films on an insulator. TV-IF filters are produced as zinc oxide on glass.

The piezoelectric layer has a thickness that is equal to half the target wavelength for the resonator in order to provide the proper resonance in the resonator. At 900 megahertz (MHz), a half-wavelength is 3.5 microns. Because the piezoelectric layer can only be formed at a slow rate of about 5 microns per hour due to processing limitations, thin film resonators are time consuming and expensive to fabricate. In addition, the substantial thickness of the piezoelectric layer for lower UHF applications causes internal stress within the resonator which leads to warping, bubbling, and cracking defects.

SUMMARY OF THE INVENTION

The present invention provides a thin film resonator and method that substantially reduces or eliminates disadvantages and problems associated with previously developed systems and methods. In particular, the conventional piezoelectric layer is replaced with a sandwich layer of piezoelectric and non-piezoelectric material that can be quickly deposited to provide a low cost and high performance thin film resonator.

In accordance with one embodiment of the present invention, a thin film or other suitable acoustic resonator comprises a first electrode and a second electrode substantially parallel to one another. An intermediate layer is disposed between and coupled to the first and second electrodes. The intermediate layer includes a first piezoelectric layer, a second piezoelectric layer, and a spacer layer disposed between the first piezoelectric layer and the second piezoelectric layer. The spacer layer has an acoustic impedance substantially the same as that of the first and second piezoelectric layers and comprises a disparate material.

More specifically, in accordance with a particular embodiment of the present invention, the spacer layer has a coefficient of thermal expansion substantially the opposite of that of the first and second piezoelectric layers. In addition, the spacer layer may be designed to offset the thermal expansion of acoustic reflectors supporting the resonator.

Technical advantages of the present invention include providing an improved acoustic resonator and improved filters employing the acoustic resonators. In particular, the acoustic resonator includes a sandwich of piezoelectric and non-piezoelectric material between the electrodes. The non-piezoelectric material is substantially uniform in thickness and readily formed during fabrication. As a result, thin film and other suitable acoustic resonators may be produced at low-cost.

Another technical advantage of the present invention includes providing an ultra high frequency (UHF) acoustic resonator. In particular, the non-piezoelectric spacer has a substantially uniform thickness over a wide range. As a result, the thickness of the resonator may be substantially increased to support cellular phone and other UHF applications.

Yet another technical advantage of the present invention includes providing a stable acoustic resonator. In particular, the spacer layer may be formed of a material having an opposite thermal expansion characteristics of the piezoelectric layer and/or the acoustic reflector. As a result, stability of the resonator is increased and the device may be configured to be insensitive to temperature within an operational range.

Still another technical advantage of the present invention includes providing an improved on-chip filter. In particular, a thin film resonator is provided that may be readily fabricated directly onto a substrate. The resonator may be combined with other resonators to form an on-chip filter and on-chip filters combined to form a single-chip transceiver.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, and in which.

DETAILED DESCRIPTION OF THE INVENTION

Figure 1:
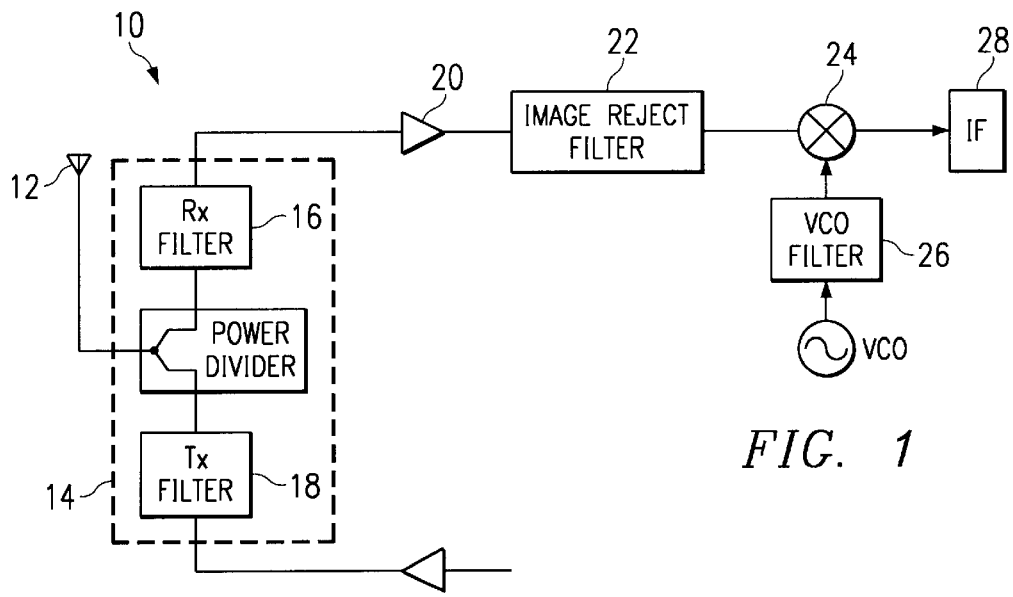
FIG. 1 is a block diagram illustrating a front end transceiver for a radio frequency device in accordance with one embodiment of the present invention.

FIG. 1 illustrates a front end transceiver 10 for a wireless device in accordance with one embodiment of the present invention. In this embodiment, the wireless device is a cellular phone operated in accordance with the American standard at the 900 megahertz (MHz) range. It will be understood that the acoustic resonators and filters of the present invention may be used in connection with other types of cellular phones, wireless devices, and other suitable devices that receive, transmit and/or use radio frequency signals.

Referring to FIG. 1, the front end transceiver 10 includes an antenna 12, a diplexer 14 including a receive filter 16, a transmit filter 18, and a power divider, a line amplifier 20, an image rejection filter 22, a mixer 24, and a voltage controlled oscillator (VCO) filter 26. As described in more detail below, one or more of the filters 16, 18, 22 and 26 may comprise thin film resonators having low insertion loss at radio frequencies. In this embodiment, the filters 16, 18, 22 and/or 26 may be fabricated on-chip, directly onto an underlying substrate to form a single chip radio. Accordingly, signal degradation of bond wire connections and bond pad capacitance associated with off-chip filters are eliminated.

The antenna 12 sends and receives signals to and from the power divider of the diplexer 14. The diplexer 14 sends an incoming signal through the receive filter 16 which filters out television, satellite communication and radio frequencies in the cellular phone application. The transmit filter 18 receives and filters outbound signals to be transmitted from the cellular phone to a base station. For incoming signals, the receive filter 16 passes the resulting band limited signal to the low noise amplifier 20. From the low noise amplifier 20, the signal is passed to the image rejection filter 22. The image rejection filter 22 suppresses pager, police radio and other thermal noise at the mixer 24 and local oscillator image frequency.

From the image rejection filter 22, the further bandwidth limited signal is passed to the mixer 24. The mixer 24 also receives a signal from the voltage controlled oscillator (VCO) filter 26 that is coupled to the VCO and implemented to remove synthesizer spurs. The resulting in-band signal is output to the intermediate frequency (IF) chain 28 for use by the cellular device.

For the 900 megahertz (MHz) cellular phone, the front end transceiver 10 may employ the IS-95, IS-136, or GSM standards. For the IS-95 and IS-136 standards, the receive filter 16 operates in the 869–894 MHz range, the transmit filter 18 operates in the 824–849 MHz range, the image rejection filter 22 operates in the 869–894 MHz range, and the voltage controlled oscillator filter 26 operates in the 940–965 MHz range. For the GSM standard, the receive filter 16 operates in the 935–960 MHz range, the transmit filter 18 operates in the 890–915 MHz range, the image rejection filter 22 operates in the 935–960 MHz range, and the voltage controlled oscillator filter 26 operates in the 1,006–1,031 MHz range. The receive and transmit filters 16 and 18 are each 25 MHz wide.

Figure 2:
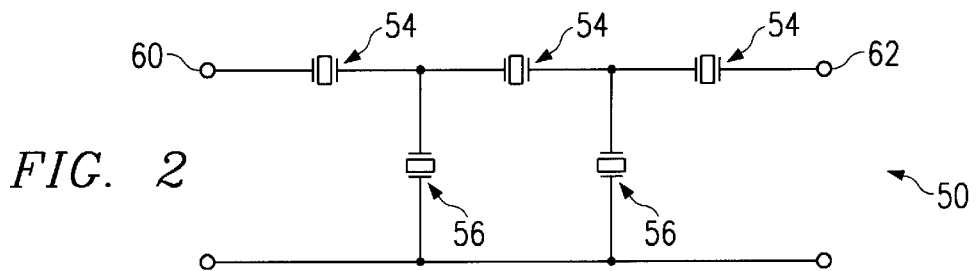
FIG. 2 is a block diagram illustrating details of the filters of FIG. 1 in accordance with one embodiment of the present invention.

FIG. 2 illustrates details of a filter 50 for the front end transceiver 10 in accordance with one embodiment of the present invention. In this embodiment, the filter 50 is a ladder filter comprising a plurality of acoustic resonators 54 and 56. The ladder filter may be used for the receive filter 16, transmit filter 18, image rejection filter 22 and/or the voltage controlled oscillator filter 26 of the front-end receiver 10. The ladder filter 50 may also be used in television, radio, wireless, and other suitable devices that use radio frequency signals.

Referring to FIG. 2, the ladder filter 50 includes a plurality of serial resonators 54 and a plurality of parallel resonators 56. The serial resonators 54 are connected in series between an input terminal 60 and an output terminal 62 to define a series arm. The parallel resonators 56 are each respectively connected in parallel between the series arm and a ground potential to define a parallel arm.

In the ladder filter 50, the resonant frequencies of the serial resonators 54 are constructed to be coincidental with the anti-resonant frequencies of the parallel resonators 56. Thus, the ladder filter 50 comprises a pass band defined by the anti-resonant frequency of the serial resonator 54 and the resonant frequencies of the parallel resonators 56. The frequency and other properties of the individual serial and parallel resonators 54 and 56 may be varied according to the particular desired function for the filter 50.

Figure 3:
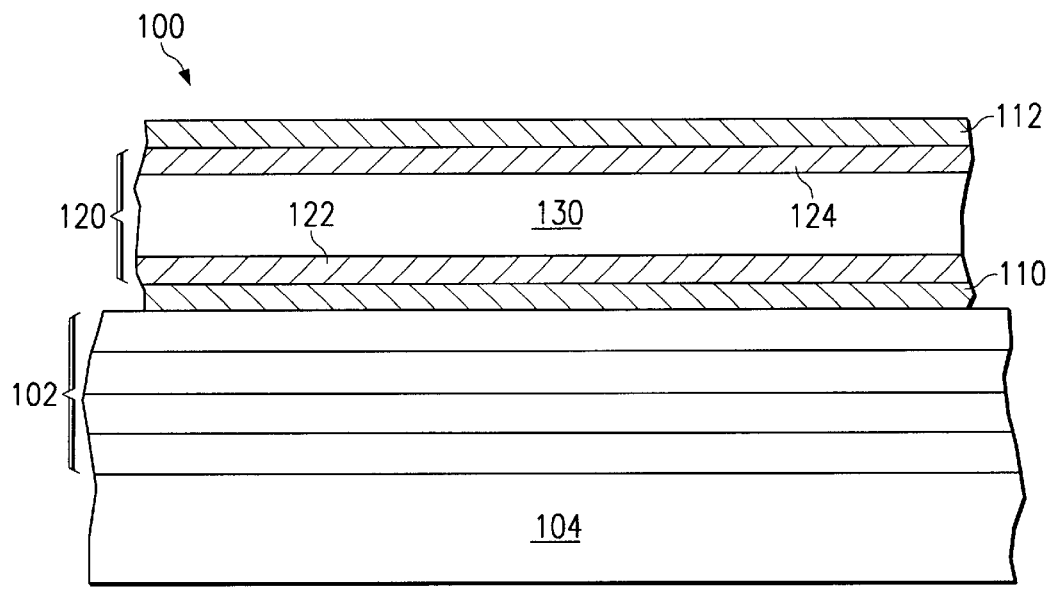
FIG. 3 is a cross-sectional diagram illustrating details of the thin film resonators of FIG. 2 in accordance with one embodiment of the present invention.

FIG. 3 illustrates details of acoustic resonator 100 for use in the ladder or other suitable filter in accordance with one embodiment of the present invention. In this embodiment, the acoustic resonator 100 is a thin 30 film resonator formed on-chip, directly on an acoustic reflector 102 that itself is formed directly on an underlying substrate 104. In accordance with a particular embodiment, the substrate 104 comprises silicon or other suitable semiconductor material and the acoustic reflector 102 comprises alternating layers having low and high acoustic impedance such as silicon dioxide ($SiO_2$) and tungsten (W). Further information regarding the structure and materials of the acoustic reflector 102 is described in co-owned U.S. Pat. application Ser. No. 09/484,803, filed Jan. 18, 2000 entitled Multiple Frequency Acoustic Reflector Array and Monolithic Cover for Resonators and Method, which is hereby incorporated by reference. In this embodiment, the resonator 100 is a solidly-mounted resonator. It will be understood that the resonator 100 may be via-isolated, air-gap isolated, or otherwise suitably supported by and acoustically isolated from any necessary substrate.

Referring to FIG. 3, the thin film resonator 100 includes a first electrode 110 disposed outwardly of the acoustic reflector 102. A second electrode 112 is substantially parallel to or co-planer with, and spaced apart from the first electrode 110 to provide the necessary quality factor. For a one gigahertz (GHz) application in which the resonator 100 has a quality factor of 1,000, the distance between the first and second electrodes 110 and 112 vary by 50 angstroms or less over the area of the resonator. The first and second electrodes 110 and 112 comprise metal or other suitable conductive material conventionally deposited. In a particular embodiment, the electrodes 110 and 112 each comprise aluminum and are between 0.1 and 1 micron thick.

An intermediate, or resonating, layer 120 is disposed between and coupled to the first and second electrodes 110 and 112. The intermediate layer includes a first piezoelectric layer 122 coupled to the first electrode 110, a second piezoelectric layer 124 coupled to the second electrode 112 and a spacer, or interstitial, layer 130 disposed between the first and second piezoelectric layers 122 and 124. To provide resonance, the intermediate layer 120 has a thickness that is a half wave length of a target frequency for the resonator 100. Thus, for a 900 MHz acoustic resonator, the intermediate layer 120 has a half-wavelength thickness of approximately 3.5 microns.

The first and second piezoelectric layers 122 and 124 each have a substantially uniform and shallow thickness to provide stability and minimize warping, bubbling, cracking or other defects. In one embodiment, the first and second piezoelectric layers 122 and 124 are each about a half micron in thickness to provide good resonator performance while minimizing piezoelectric thickness, which using conventional sputter techniques, has a deposition rate of about 5 microns per hour. The thickness of the first and second piezoelectric layers 122 and 124 may be suitably adjusted to control the quality factor for the resonator 100. This independent control of the piezoelectric layer thickness provides an additional design factor for optimizing resonator 100 performance. The intermediate or resonating layer material comprises zinc oxide (ZnO), aluminum nitride (ALN), silicon nitride (SiN), gallium arsenide (GaAs), tungsten (W), or other suitable materials having acceptable electromechanical coupling coefficients.

The spacer 130 is substantially uniform in thickness and may comprise the bulk of the thickness of the intermediate layer 120 depending on the frequency of the resonator 100. The spacer layer 130 should be formed from a material that can be deposited at a relatively high rate and at a substantially uniform thickness up to three or more microns. In addition, the material of the spacer layer 130 should have an acoustic impedance that matches or is substantially the same as that of the piezoelectric layers 122 and 124. The acoustic impedance of the layers 122, 124, and 130 are substantially the same when they are within twenty (20) percent of one another. In addition, to provide stability for the resonator and the filter 50, the thermal expansion characteristics of the spacer 130 should be opposite the thermal expansion characteristics of the piezoelectric layers 122 and 124. Aluminum nitride (ALN), for example, has a thermal expansion coefficient of 28 °ppm/C. while zinc oxide (ZnO) has a thermal expansion coefficient of 60 ppm/° C. Materials have an opposite thermal expansion coefficient when layers made from the materials form a structure that is largely insensitive to temperature at least at room temperature. Preferably, the device is at most quadratic with temperature and has a zero slope at room temperature. Materials for the spacer layer 130 include silicon dioxide ($SiO_2$) and aluminum (Al).

Figure 4:
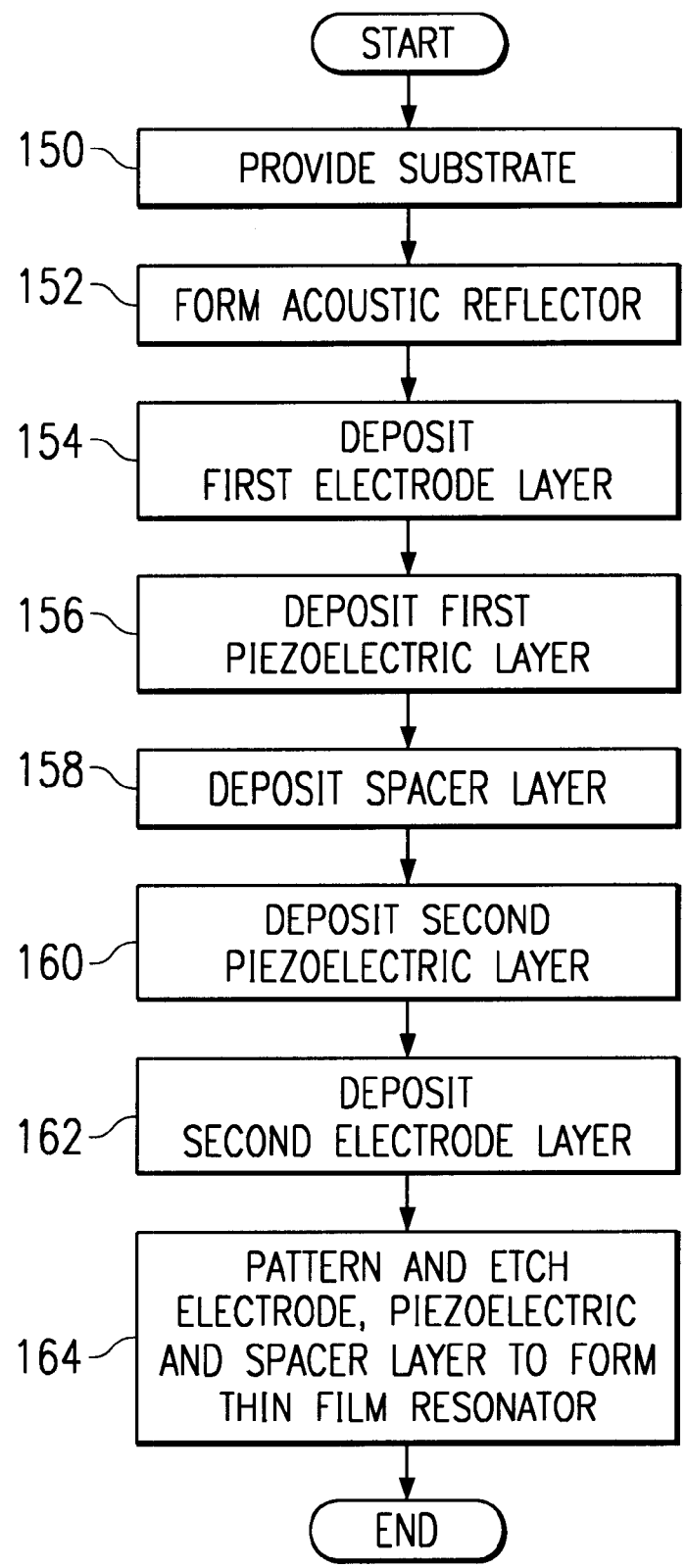
FIG. 4 is a flow diagram illustrating a method for fabricating the thin film resonator of FIG. 3 in accordance with one embodiment of the present invention.

FIG. 4 is a flow diagram illustrating a method for fabricating the thin film resonator 100 in accordance with one embodiment of the present invention. In this embodiment, the resonator 100 is formed on-chip directly onto the acoustic reflector 102. It will be understood that the acoustic resonator may be formed on other suitable supports without departing from the scope of the present invention.

Referring to FIG. 4, the method begins at step 150 in which the substrate 104 is provided. The substrate 104 may comprise silicon, other semiconductor, or other suitable support material. Next, at step 152, the acoustic reflector 102 is formed outwardly of the substrate 104. The acoustic reflector 102 may be formed as described in U.S. Patent Application entitled "Multiple Frequency Acoustic Reflector Array and Monolithic Cover for Resonators and Method" previously incorporated by reference.

Proceeding to step 154, the first electrode 110 is conventionally deposited outwardly of the acoustic reflector 102. At step 156, the first piezoelectric layer 122 is deposited outwardly of the first electrode 110 using a conventional sputter or other suitable process. At step 158, the spacer layer 130 is deposited outwardly of the first piezoelectric layer 122. The spacer layer 130 is deposited by DC plasma magnetron reactive sputtering system, electron cyclotron resonance-chemical vapor deposition (ECR-CVD), and other suitable processes.

Next, at step 160, the second piezoelectric layer 124 is deposited outwardly of the spacer layer 130. Together, the first and second piezoelectric layers 122 and 124 along with the spacer layer 130 form a substantially uniform intermediate layer 130 and have a thickness of an acoustic half-wavelength of the desired frequency for the resonator 100. At step 162, the second electrode layer 112 is conventionally deposited outwardly of the second piezoelectric layer 124.

Proceeding to step 164, the deposited layers are suitably patterned and etched or otherwise suitably processed to remove excess material and form the thin film resonator 100. In this way, a low-cost and high-performance thin film resonator 100 is fabricated for use in radio filters for televisions, radios, cellular phones, wireless devices and other suitable devices that transmit, receive, and/or use radio frequency signals.

Although the present invention has been described as several embodiments, various changes and modifications may be suggested to one skilled in the art. It is intended that the present invention encompass such changes and modifications as fall within the scope of the appended claims.

What is claimed is:

1. An acoustic resonator, comprising:
a first electrode;
a second electrode substantially parallel to the first electrode;
an intermediate layer disposed between and coupled to the first and second electrodes;
the intermediate layer comprising a first piezoelectric layer, a second piezoelectric layer, and a non-piezoelectric spacer disposed between and directly connected to the first and second piezoelectric layers, and devoid of any electrodes located between the non-piezoelectric spacer and the first and second piezoelectric layers, with the first piezoelectric layer disposed adjacent to the first electrode and the second piezoelectric layer disposed adjacent to the second electrode; and
the spacer layer having an acoustic impedance substantially the same as that of the first and second piezoelectric layers and comprising a disparate material.

2. The acoustic resonator of claim 1, the resonator comprising a thin film resonator.

3. The acoustic resonator of claim 1, the intermediate layer comprising a thickness substantially an acoustic half-wavelength of a target wavelength for the resonator.

4. The acoustic resonator of claim 1, the first and second piezoelectric layers each comprising a thickness of about a half micron or less.

5. The acoustic resonator of claim 1, the spacer further comprising silicon dioxide (SiO$_2$).

6. The acoustic resonator of claim 1, the spacer comprising a coefficient of thermal expansion substantially the opposite as that of the first and second piezoelectric layers.

7. The acoustic resonator of claim 1, the intermediate layer further comprising a thickness of at least three microns.

8. A thin film resonator, comprising:

a first electrode;

a second electrode substantially parallel to and spaced apart from the first electrode;

an intermediate layer disposed between and coupled to the first and second electrodes and having a thickness substantially an acoustic half-wavelength of a target frequency for the thin film resonator;

the intermediate layer comprising a first piezoelectric layer adjacent to the first electrode, a second piezoelectric layer adjacent to the second electrode, and a spacer layer disposed between and directly connected to the first and second piezoelectric layers and devoid of any electrodes located between the spacer layer and the first and second piezoelectric layers, with the first piezoelectric layer disposed adjacent to the first electrode and the second piezoelectric layer disposed adjacent to the second electrode; and the spacer layer comprising a non-piezoelectric material and having an acoustic impedance substantially the same as that of the first and second piezoelectric layers.

9. The thin film resonator of claim 8, wherein the thin film resonator is a 900 megahertz (MHz) resonator and the intermediate layer has a thickness of approximately 3.5 microns.

10. The thin film resonator of claim 8, the first and second piezoelectric layers comprising zinc oxide (ZnO) and the spacer layer comprises silicon dioxide (SiO$_2$).

11. An integrated circuit chip including a plurality of on-chip filters, at least one of the filters comprising a thin film resonator, the thin film resonator comprising:

a first electrode;

a second electrode substantially parallel to the first electrode;

an intermediate layer disposed between and coupled to the first and second electrode;

the intermediate layer comprising a first piezoelectric layer, a second piezoelectric layer, and a non-piezoelectric spacer layer disposed between and directly connected to the first and second piezoelectric layers and devoid of any electrodes located between the spacer layer and the first and second piezoelectric layers, with the first piezoelectric layer disposed adjacent to the first electrode and the second piezoelectric layer disposed adjacent to the second electrode; and the spacer layer having an acoustic impedance substantially the same as that of the first and second piezoelectric layers and comprising a disparate material.

12. The integrated circuit chip of claim 11, the intermediate layer comprising a thickness substantially a half-wavelength of a target frequency for the thin film resistor.

13. The integrated circuit chip of claim 11, the first and second piezoelectric layers each comprising a thickness of about a half micron or less and the intermediate layer comprising a thickness of about three microns or more.

14. The integrated circuit chip of claim 11, the spacer layer comprising a coefficient of thermal expansion substantially opposite of that of the first and second piezoelectric layers.

* * * * *